US009899141B2

(12) United States Patent
Lee et al.

(10) Patent No.: US 9,899,141 B2
(45) Date of Patent: Feb. 20, 2018

(54) COMMON MODE FILTER AND METHOD OF MANUFACTURING THE SAME

(71) Applicant: SAMSUNG ELECTRO-MECHANICS CO., LTD., Suwon-si, Gyeonggi-do (KR)

(72) Inventors: Jong Yun Lee, Suwon-si (KR); Sung Kwon Wi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 388 days.

(21) Appl. No.: 14/139,433

(22) Filed: Dec. 23, 2013

(65) Prior Publication Data

US 2014/0176284 A1 Jun. 26, 2014

(30) Foreign Application Priority Data

Dec. 26, 2012 (KR) ........................ 10-2012-0153494

(51) Int. Cl.

*H01F 5/00* (2006.01)
*H01L 27/08* (2006.01)
*H01F 27/29* (2006.01)
*H01F 17/00* (2006.01)

(52) U.S. Cl.

CPC ....... *H01F 27/292* (2013.01); *H01F 17/0013* (2013.01); *H01F 2017/0093* (2013.01); *Y10T 29/4902* (2015.01)

(58) Field of Classification Search

CPC ............. H01F 27/2804; H01F 17/0013; H01F 2017/0086; H01F 5/00; H01L 2924/30107; H01L 23/5227; H01L 23/645; H01L 28/10

USPC ............... 336/200, 205, 208, 232; 29/602.1; 257/531

See application file for complete search history.

(56) References Cited

U.S. PATENT DOCUMENTS 5,955,931 A * 9/1999 Kaneko ................ H03H 7/0115 333/175
6,114,925 A * 9/2000 Lo ........................... H01P 1/203 333/185
6,380,048 B1 * 4/2002 Boon et al. ................... 438/456
6,618,929 B2 * 9/2003 Kitamura ............ H01F 17/0013 29/602.1

(Continued)

FOREIGN PATENT DOCUMENTS

JP 36-009121 U 2/1994
JP 07-272934 A 10/1995

(Continued)

OTHER PUBLICATIONS

Notice of Allowance Korean Patent Application No. 10-2012-0153494 dated Dec. 12, 2013.

(Continued)

*Primary Examiner* — Elvin G Enad
*Assistant Examiner* — Joselito Baisa
(74) *Attorney, Agent, or Firm* — McDermott Will & Emery LLP

(57) ABSTRACT

Disclosed herein are a method of manufacturing a common mode filter forming a coil electrode by directly patterning metal layers laminated on both surfaces of a core insulating layer while not using a build-up process, and the common mode filter manufactured according to the method.

13 Claims, 5 Drawing Sheets

(56) References Cited

U.S. PATENT DOCUMENTS 6,987,307 B2 * 1/2006 White ................. H01F 17/0006 257/508
7,667,557 B2 * 2/2010 Chen ........................ H03H 1/00 333/175
7,843,701 B2 * 11/2010 Kudo .................... H01F 27/027 336/200
7,999,634 B2 * 8/2011 Sakisaka .............. H03H 7/0115 333/167
8,050,045 B2 * 11/2011 Okuzawa .............. H01F 27/292 29/830
8,120,445 B2 * 2/2012 Liu et al. ....................... 333/181
8,174,349 B2 * 5/2012 Yoshida et al. ............... 336/200
8,325,003 B2 * 12/2012 Wu ............................... 336/200
8,505,192 B2 * 8/2013 Chu .................... H01F 17/0013 29/592.1
8,587,400 B2 * 11/2013 Nakajima et al. ............ 336/200
8,633,793 B1 * 1/2014 Chang ................. H01F 17/0013 336/182
8,878,641 B2 * 11/2014 Nishikawa et al. .......... 336/200
2005/0016793 A1 * 1/2005 O'Regan ................... B32B 5/18 181/290
2005/0105478 A1 5/2005 Hwang et al.
2007/0085647 A1 * 4/2007 Kawarai ......................... 336/83
2008/0100409 A1 * 5/2008 Nishikawa .......... H01F 17/0006 336/200
2008/0257488 A1 * 10/2008 Yamano .............. H01F 17/0013 156/272.4
2010/0157565 A1 * 6/2010 Yoshida ................ H01F 27/292 361/811
2011/0007439 A1 1/2011 Asakawa et al.
2011/0291790 A1 * 12/2011 Okumura ............ H01F 17/0013 336/200
2012/0119863 A1 5/2012 Wu
2012/0133472 A1 5/2012 Nishikawa et al.

FOREIGN PATENT DOCUMENTS

| | | | |
|---|---|---|---|
| JP | 2000-306729 | A | 11/2000 |
| JP | 2005-072065 | A | 3/2005 |
| JP | 2005-73265 | A | 3/2005 |
| JP | 2008-118059 | A | 5/2008 |
| JP | 2009-188111 | A | 8/2009 |
| JP | 2009-253233 | A | 10/2009 |
| JP | 2010-283289 | A | 12/2010 |
| JP | 2011-18756 | A | 1/2011 |
| JP | 2011-71457 | A | 4/2011 |
| JP | 2012-009798 | A | 1/2012 |
| JP | 2012-015494 | A | 1/2012 |
| JP | 2012-114363 | A | 6/2012 |
| KR | 10-2010-0129561 | A | 12/2010 |

OTHER PUBLICATIONS

Japanese Office Action dated Nov. 11, 1014 issued in Japanese Patent Application No. 2013-242659.

Notice of Office Action Japanese Patent Application No. 2013-242659 dated Oct. 6, 2015 with full English translation.

* cited by examiner

[FIG. 1]
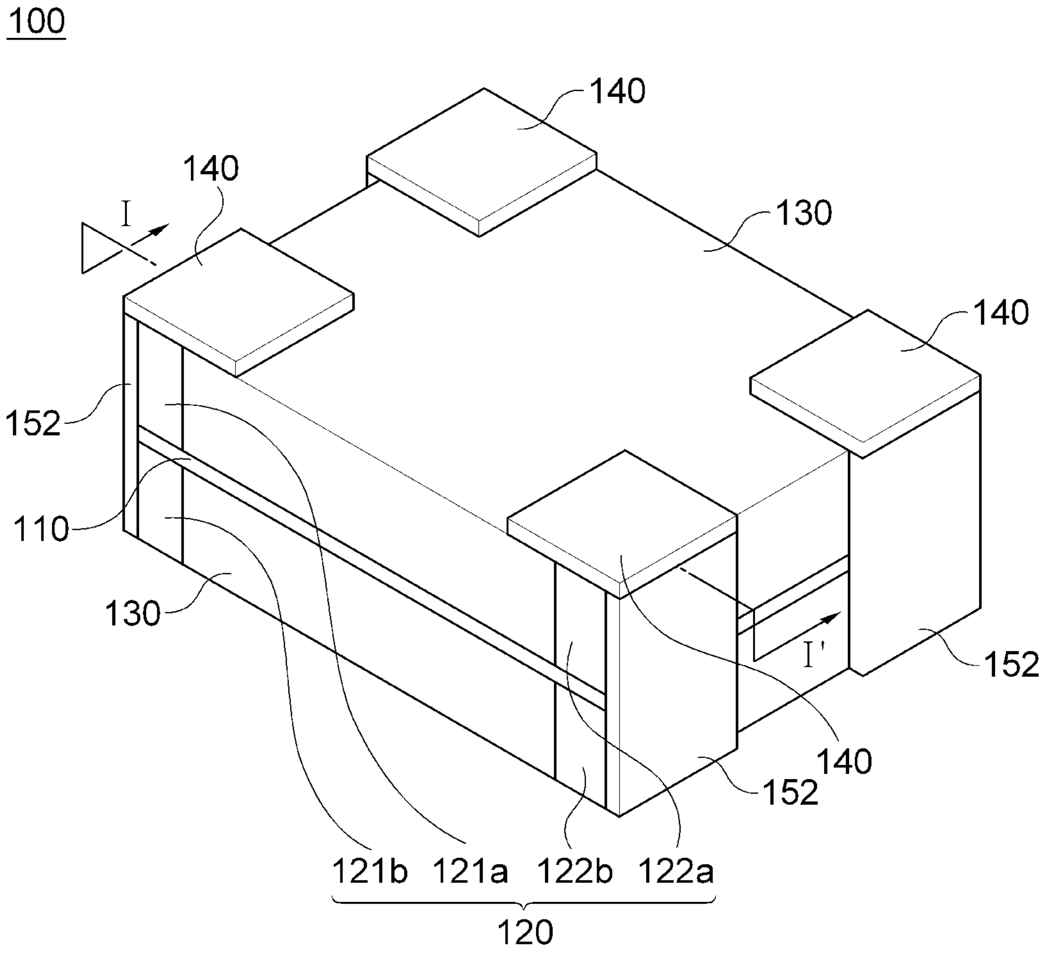

[FIG. 2]
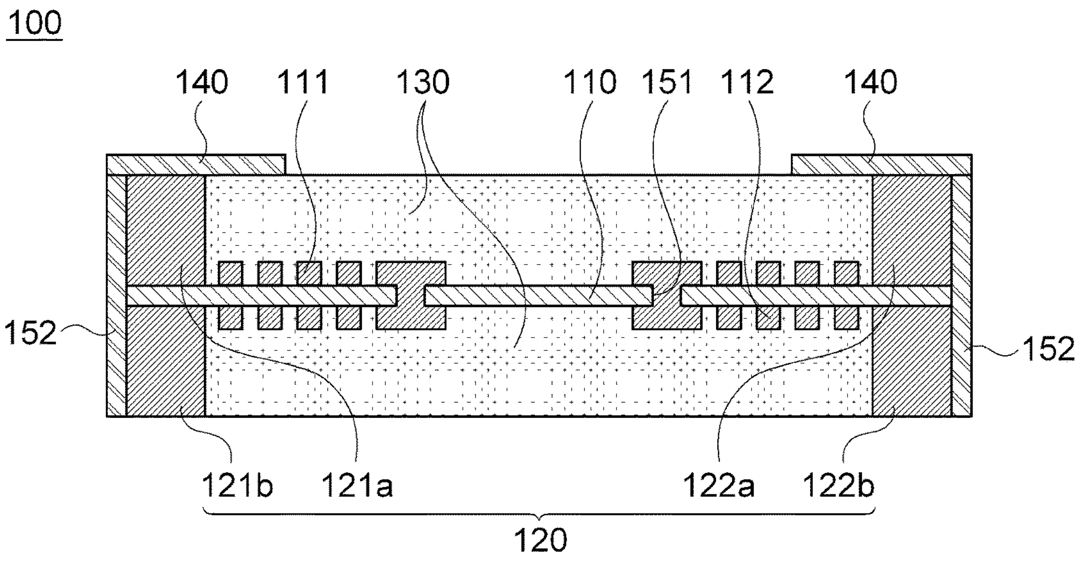
[FIG. 3]
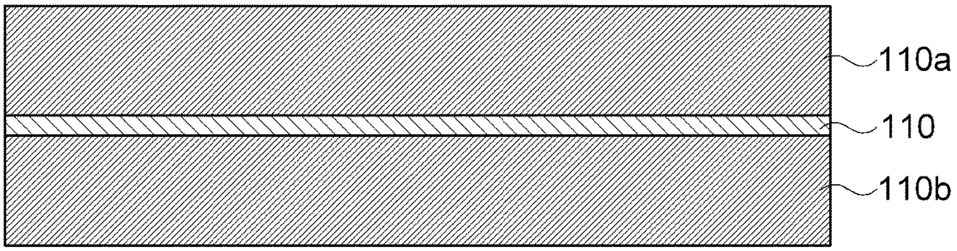
[FIG. 4]
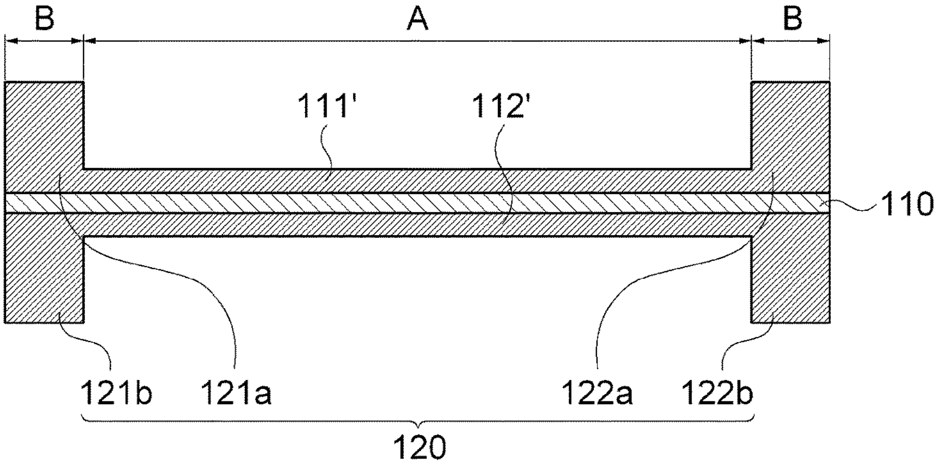

[FIG. 5]
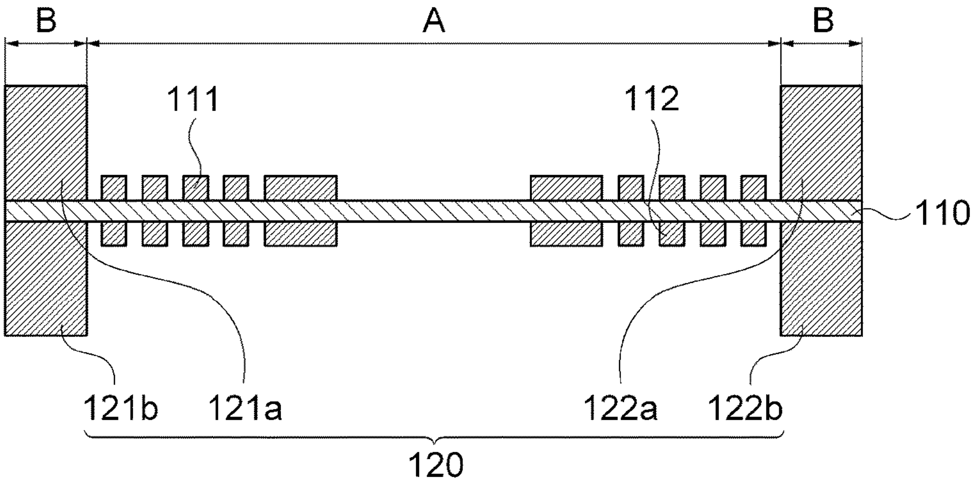
[FIG. 6]
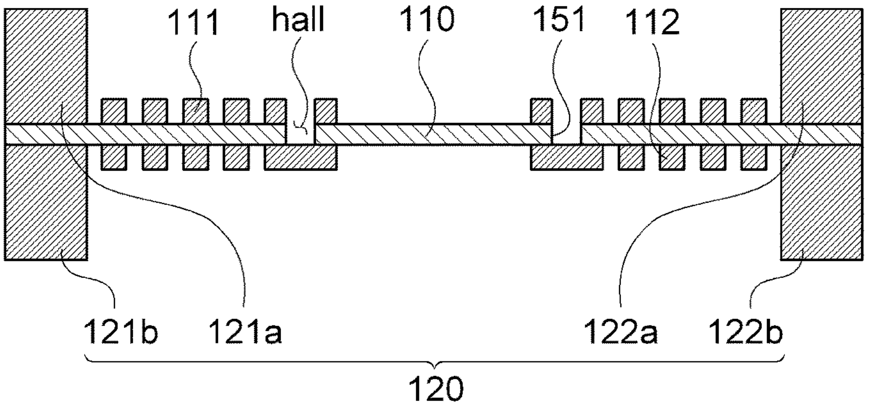
[FIG. 7]
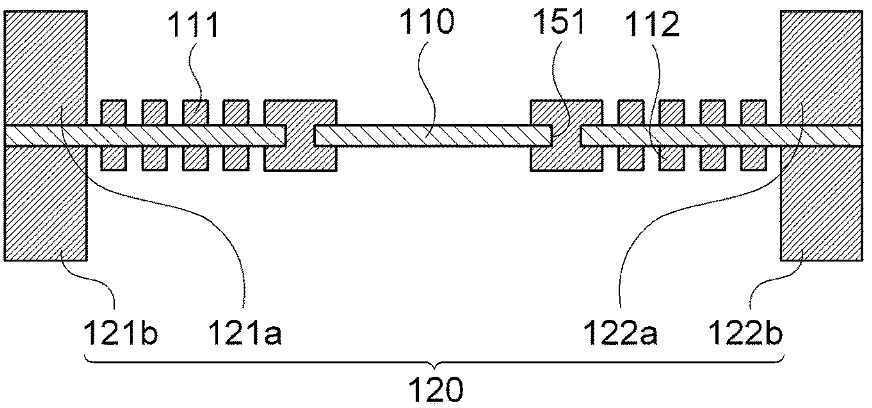

[FIG. 8]
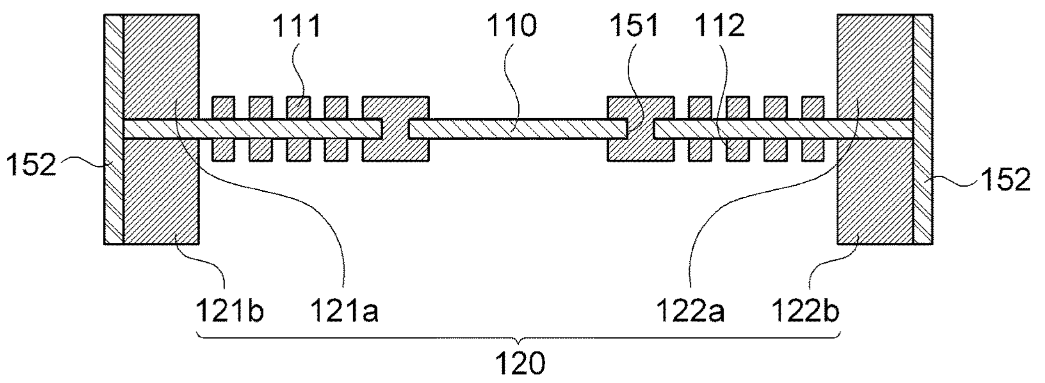
[FIG. 9]
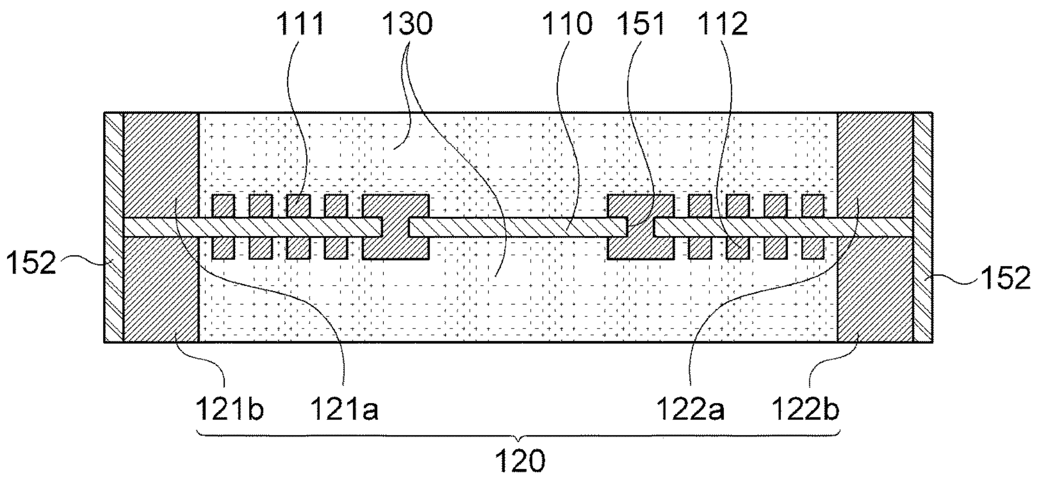

[FIG. 10]
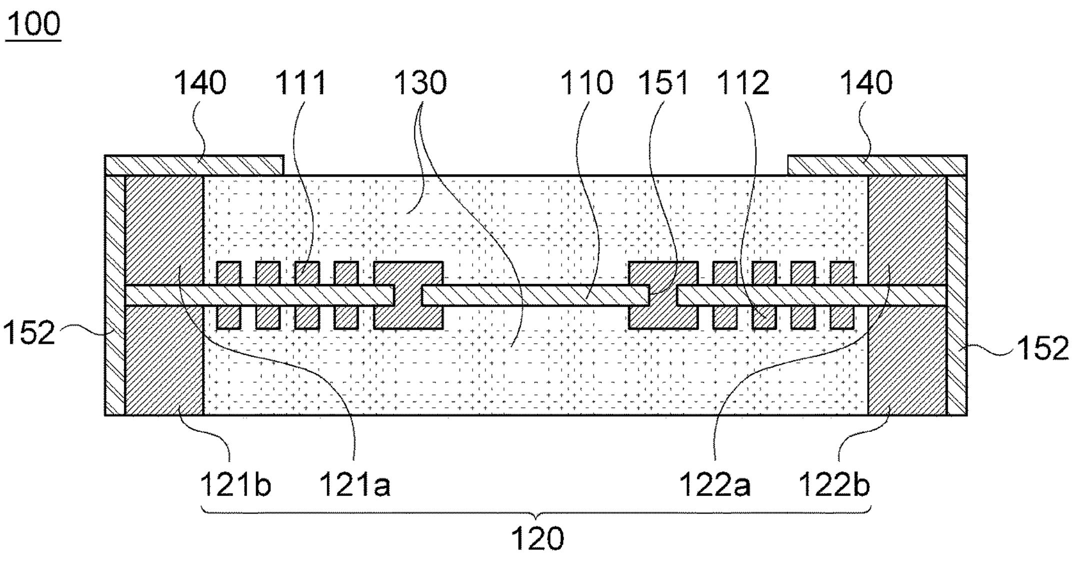

COMMON MODE FILTER AND METHOD OF MANUFACTURING THE SAME

CROSS REFERENCE(S) TO RELATED APPLICATIONS

This application claims the benefit under 35 U.S.C. Section 119 of Korean Patent Application Serial No. 10-2012-0153494, entitled "Common Mode Filter and Method of Manufacturing the Same" filed on Dec. 26, 2012, which is hereby incorporated by reference in its entirety into this application.

BACKGROUND OF THE INVENTION

1. Technical Field

The present invention relates to a common mode filter, and more particularly, to a common mode filter having a coil electrode formed on both surfaces of a core layer and a method of manufacturing the same.

2. Description of the Related Art

In accordance with a development of technology, electronic devices such as a portable phone, home appliances, a personal computer (PC), a personal digital assistant (PDA), a liquid crystal display (LCD) and the like have converted from the analog method to the digital method and have high-speed characteristics due to an increase in an amount of data to be processed. Therefore, USB 2.0, USB 3.0, and a high-definition multimedia interface (HDMI) have come into wide use as a high-speed signal transmission interface and have been used in many digital devices such as a personal computer and a digital high-definition television.

These interfaces employ a differential signal system transmitting a differential signal (a differential mode signal) using a pair of signal lines unlike a single-end transmission system generally used for a long time.

Therefore, in order to remove common mode noise, a common mode filter is generally used in a high-speed differential signal line and the like. Here, the common mode noise is noise generated in the differential signal line, and the common mode filter removes the noise capable of being removed by an existing electromagnetic interference (EMI) filter.

Referring to Japanese Patent Laid-Open Publication No. 2012-015494, a general common mode filter according to the related art has a structure in which a pair of primary and secondary conductor coils are included in an insulating layer and the primary and secondary conductor coils are spaced from each other having an insulating resin configuring the insulating layer therebetween. In order to manufacture the common mode filter having the above-mentioned structure, processes of applying the insulating resin and plating the coil electrode are needed to be repeatedly performed by generally performing a build-up process.

However, this causes an increase in process number according to a laminating number of the conductor coils to thereby become a factor of decreasing productivity and increasing manufacturing costs. Therefore, a technology capable of manufacturing the common mode filter using a simpler method is urgently demanded.

RELATED ART DOCUMENT

Patent Document (Patent Document 1) Japanese Patent Laid-Open Publication No. 2012-015494

SUMMARY OF THE INVENTION

An object of the present invention is to provide a common mode filter capable of forming coil electrodes and an external electrode terminal without performing a build-up process and a method of manufacturing the same, thereby solving a decrease in productivity and an increase in manufacturing costs due to an increase in process number.

According to an exemplary embodiment of the present invention, there is provided a common mode filter, including: a core insulating layer; coil electrodes formed on both surfaces of the core insulating layer; external electrode terminals connected to end portions of the coil electrode; and an external insulating layer covering a surface of the core insulating layer, wherein the external electrode terminals are formed to face both surfaces of the core insulating layer and are connected by a connection electrode.

The coil electrodes formed on both surfaces of the core insulating layer may be connected to each other by a via penetrating through the core insulating layer.

The coil electrodes may be configured of a first coil electrode and a second coil electrode alternatively disposed on the same layer.

The external insulating layer may have the same diameter as that of the external electrode terminal.

The common mode filter may further include a surface electrode formed on one surface of the external insulating layer and bonded to the external electrode terminal.

According to another exemplary embodiment of the present invention, there is provided a method of manufacturing a common mode filter, the method including: preparing a core insulating layer having metal layers laminated on both surfaces thereof; performing half etching on the remainder region with exception of a region forming an external electrode terminal in the metal layers; selectively etching the metal layers of the half etched region to form a coil electrode; forming a connection electrode connecting the external electrode terminals to each other formed to face both surfaces of the core insulating layer; and forming an external insulating layer covering a surface of the core insulating layer.

The metal layer laminated on both surfaces of the prepared core insulating layer may have the same thickness as that of the external electrode terminal.

After the forming of the coil electrode, a hall penetrating through the coil electrode and the core insulating layer may be processed and an inner portion of the hall may be filled and plated to thereby form a via.

In the forming of the external insulating layer, the external insulating layer may be formed up to a height of the external electrode terminal.

A surface electrode bonded to the external electrode terminal may be formed on one surface of the external insulating layer.

BRIEF DESCRIPTION OF THE DRAWINGS

FIG. 1 is a perspective view of a common mode filter according to an exemplary embodiment of the present invention;

FIG. 2 is a cross-sectional view taken along the line I-I' of FIG. 1; and FIGS. 3 to 10 are process views sequentially showing a method of manufacturing the common mode filter according to the exemplary embodiment of the present invention.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

FIG. 1 is a perspective view of a common mode filter according to an exemplary embodiment of the present invention and FIG. 2 is a cross-sectional view taken along the line I-I' of FIG. 1. Additionally, components shown in the accompanying drawings are not necessarily shown to scale. For example, sizes of some components shown in the accompanying drawings may be exaggerated as compared with other components in order to assist in the understanding of the exemplary embodiments of the present invention. For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure.

Referring to FIGS. 1 and 2, a common mode filter 100 according to the exemplary embodiment of the present invention may include a core insulating layer 110, coil electrodes 111 and 112 of upper and lower layers formed on both surface of the core insulating layer 110, external electrode terminals 120 connected to the coil electrodes 111 and 112, and an external insulating layer 130 covering a surface of the core insulating layer 110. The common mode filter 100 according to the exemplary embodiment of the present invention may further include surface electrodes 140 formed on one surface of the external insulating layer 130.

The core insulating layer 110 electrically insulates between the coil electrodes 111 and 112 of the upper and lower layers, and the external insulating layer 130 is a layer protecting the coil electrodes 111 and 112 from the outside and a configuration material of the external insulating layer 130 may be appropriately selected in consideration of an insulating property, a heat-resisting property, a water-resisting property, and the like. For example, examples of optimal polymer materials configuring the core insulating layer 110 and the external insulating layer 130 include a thermosetting resin such as an epoxy resin, a phenol resin, a urethane resin, a silicon resin, a polyimide resin and like, a thermoplastic resin such as a polycarbonate resin, an acrylic resin, a polyacetal resin, a polypropylene resin, and the like.

Meanwhile, as described below, since the common mode filter 100 according to the exemplary embodiment of the present invention is manufactured using the core insulating layer 110 having metal layers laminated on both surfaces thereof, the core insulating layer 110 may use a resin (for example, prepreg) in which a reinforcement material such as a glass fiber or an inorganic filler is impregnated in the above described materials in order to enhance hardness thereof.

The coil electrodes 111 and 112 which are a conductor plated in a spiral shape on a co-plane, may be formed by patterning the metal layer laminated on the core insulating layer 110.

The above-mentioned coil electrodes 111 and 112 may be configured of a first coil electrode and a second coil electrode electromagnetically coupled to each other, wherein the first coil electrode and the second coil electrode may be alternatively disposed on the same layer. That is, the coil electrode 111 of the upper layer may be configured of the first coil electrode and the second coil electrode which are alternatively disposed and the coil electrode 112 of the lower layer may also be configured of the first coil electrode and the second coil electrode which are alternatively disposed.

In this case, the first coil electrode of the upper layer and the first coil electrode of the lower layer may be connected to each other through a via 151 penetrating through the core insulating layer 110, and the second coil electrode of the upper layer and the second coil electrode of the lower layer may also be connected to each other through the via 151 penetrating through the core insulating layer 110.

The external electrode terminals 120 connected to the end portions of the coil electrodes 111 and 112 are formed at an edge of the core insulating layer 110 and are formed to face both surfaces of the core insulating layer 110. In addition, the external electrode terminals 120 formed to face both surfaces of the core insulating layer 110 may be electrically connected by a connection electrode 152 formed on a side wall of an element.

For example, assuming that the coil electrodes 111 and 112 are configured of the first coil electrode and the second coil electrode as described above, first external electrode terminals 121*a* and 121*b* of upper and lower layers formed to face both surfaces of the core insulating layer 110 are electrically connected to each other by the connection electrode 152, and the first external electrode terminal 121*a* of the upper layer or the first external electrode terminal 121*b* of the lower layer is connected to one end of the first coil electrode of the same layer. In addition, the other end of the first coil electrode is connected to the external electrode terminal positioned at an opposite side of the first external electrode terminal 121 in the same structure as that of one end of the first coil electrode.

Similarly, second external electrode terminals 122*a* and 122*b* of upper and lower layers formed to face both surfaces of the core insulating layer 110 are electrically connected to each other by the connection electrode 152, and the second external electrode terminal 122*a* of the upper layer or the second external electrode terminal 122*b* of the lower layer is connected to one end of the second coil electrode of the same layer. In addition, the other end of the second coil electrode is connected to the external electrode terminal positioned at an opposite side of the second external electrode terminals 122*a* and 122*b* in the same structure as that of one end of the second coil electrode.

The external insulating layer 130 may be formed with the same thickness as the external electrode terminal 120 in the remainder portion with the exception of a region in which the external electrode terminal 120 is formed from the core insulating layer 110.

The surface electrode 140 which is an electrode for securing connectivity between a circuit wiring on a substrate and the external electrode terminal 120, is formed on one surface of the external insulating layer 130 and is bonded to the external electrode terminal 120.

Meanwhile, although the drawings show that the external electrode terminal 120 and the connection electrode 152, the surface electrode 140 and the connection electrode 152, and the external electrode terminal 120 and the surface electrode 140 are separated therebetween, respectively, in order to easily describe the present invention, in the case in which the external electrode terminal 120, the connection electrode 152, and the surface electrode 140 are configured of the same material, they may be formed integrally with one another without being separated in external appearance.

Hereinafter, a method of manufacturing a common mode filter 100 according to an exemplary embodiment of the present invention will be described.

FIGS. 3 to 10 are process views sequentially showing a method of manufacturing the common mode filter 100 according to the exemplary embodiment of the present invention and the method of manufacturing the common mode filter 100 according to the exemplary embodiment of the present invention first prepares the core insulating layer 110 having metal layers 110*a* and 110*b* laminated on both surfaces thereof as shown in FIG. 3.

The metal layers 110*a* and 110*b*, which are layers forming the coil electrodes 111 and 112 and the external electrode terminal 120, may be made of metal material such as Ni, Pd, Ag—Pd, and Cu.

As described above, when the core insulating layer 110 having the metal layers 110*a* and 110*b* laminated on both surfaces thereof is prepared, half etching is performed on surfaces of the metal layers 110*a* and 110*b* as shown in FIG. 4. In this case, a mask (not shown in the drawings) is closely adhered to a predetermined region B of the metal layers 110*a* and 110*b* so that the metal layers 110*a* and 110*b* are not etched.

Therefore, metal layers 111' and 112' in a region A in which the half etching is performed become base layers for forming the coil electrodes 111 and 112, and the metal layer in the region B in which etching is not performed due to the mask becomes the external electrode terminal 120. Therefore, in FIG. 3, thicknesses of the metal layers 110*a* and 110*b* laminated on the core insulating layer 110 may be determined according to a thickness of the external electrode terminal 120.

Next, as shown in FIG. 5, the metal layers 111' and 112' in the region A are selectively etched, such that the coil electrode 111 and 112 are formed. This may use a known pattern forming technology.

When the coil electrodes 111 and 112 are formed, a via for electrically connecting between layers is formed. In order to form the via, a hall penetrating through the coil electrode 111 of the upper layer (or the coil electrode 112 of the lower layer) and the core insulating layer 110 is first processed at a predetermined position as shown in FIG. 6. Next, as shown in FIG. 7, an inner portion of the hall is filled and plated to form a via 151, thereby connecting the coil electrodes 111 and 112 of the upper and lower layers to each other.

Next, as shown in FIG. 8, the connection electrode 152 connecting the external electrode terminals 120 formed to face both surfaces of the core insulating layer 110 is formed. The forming of the connection electrode 152 is not necessarily performed after forming the coil electrodes 111 and 112, but it may be performed regardless of the order when the core insulating layer 110 having the metal layers 110*a* and 110*b* laminated on both surfaces thereof as shown in FIG. 3. However, in the case in which the connection electrode 152 is formed in advance, the connection electrode 152 needs not to be etched at the time of the half etching for forming the coil electrodes 111 and 112. Therefore, the forming of the connection electrode 152 is advantageously performed after forming the coil electrodes 111 and 112.

Next, as shown in FIG. 9, the external insulating layer 130 having the same thickness as that of the external electrode terminal 120 is formed on the core insulating layer 110 using a dip coating method, a spin coating method or the like, and finally, as shown in FIG. 10, the surface electrode 140 bonded to the external electrode terminal 120 is plated, thereby finally completing the common mode filter 100 according to the exemplary embodiment of the present invention.

As described above, the present invention forms the coil electrodes 111 and 112 by directly patterning the metal layers 110*a* and 110*b* laminated on both surfaces of the core insulating layer 110 while not using the build-up process, thereby making it possible to significantly decrease the process number.

In addition, the external electrode terminal 120 is naturally formed while a specific region of the metal layers 110*a* and 110*b* is not etched, such that a process for forming the external electrode terminal 120 as in the related art needs not to be separately performed.

According to the exemplary embodiment of the present invention, coil electrodes and an external electrode terminal are formed using a metal layer laminated on a core insulating layer without using a build-up process as in the related art, thereby making it possible to increase productivity of a product and decrease manufacturing costs.

The above detailed description has illustrated the present invention. Although the exemplary embodiments of the present invention have been described, the present invention may be also used in various other combinations, modifications, and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A common mode filter, comprising:

a core insulating layer;

coil electrodes formed on both surfaces of the core insulating layer;

external electrode terminals connected to end portions of the coil electrode; and an external insulating layer covering a surface of the core insulating layer, wherein the external electrode terminals are formed to face both surfaces of the core insulating layer and are disposed on, and in direct contact with, the core insulating layer, wherein the external electrode terminals are separated by the core insulating layer, wherein separated parts of the external electrode terminals are electrically connected by a connection electrode, and wherein the core insulating layer extends to, and is in direct contact with, the connection electrode.

2. The common mode filter according to claim 1, wherein the coil electrodes formed on both surfaces of the core insulating layer are connected to each other by a via penetrating through the core insulating layer.

3. The common mode filter according to claim 1, wherein the coil electrodes are configured of a first coil electrode and a second coil electrode alternatively disposed on the same layer.

4. The common mode filter according to claim 1, wherein the external insulating layer has the same diameter as that of the external electrode terminal.

5. The common mode filter according to claim 1, further comprising a surface electrode formed on one surface of the external insulating layer and bonded to the external electrode terminal.

6. A common mode filter, comprising:

a core insulating layer;

coil electrodes formed on both surfaces of the core insulating layer;

external electrode terminals connected to end portions of the coil electrode; and an external insulating layer covering a surface of the core insulating layer, wherein the external electrode terminals are formed to face both surfaces of the core insulating layer and to overlap an outer side surface of the external insulating layer in a direction perpendicular to a thickness direction of the common mode filter, wherein the external electrode terminals are disposed on, and in direct contact with the core insulating layer, wherein the external electrode terminals are separated by the core insulating layer, wherein separated parts of the external electrode terminals are electrically connected by a connection electrode, and wherein the core insulating layer extends to, and is in direct contact with, the connection electrode.

7. A method of manufacturing a common mode filter, the method comprising:

preparing a core insulating layer having metal layers laminated on both surfaces thereof;

performing half etching on the remainder region with exception of a region forming an external electrode terminal in the metal layers;

selectively etching the metal layers of the half etched region to form a coil electrode;

forming a connection electrode connecting the external electrode terminals to each other formed to face both surfaces of the core insulating layer; and forming an external insulating layer covering a surface of the core insulating layer, wherein the core insulating layer extends to, and is in direct contact with, the connection electrode.

8. The method according to claim 7, wherein the metal layer laminated on both surfaces of the prepared core insulating layer has the same thickness as that of the external electrode terminal.

9. The method according to claim 7, wherein after the forming of the coil electrode, a hall penetrating through the coil electrode and the core insulating layer is processed and an inner portion of the hall is filled and plated to thereby form a via.

10. The method according to claim 7, wherein in the forming of the external insulating layer, the external insulating layer is formed up to a height of the external electrode terminal.

11. The method according to claim 7, wherein a surface electrode bonded to the external electrode terminal is formed on one surface of the external insulating layer.

12. The method according to claim 7, wherein the external electrode terminals are disposed directly on the core insulating layer.

13. The method according to claim 7, wherein the external electrode terminals are formed to overlap an outer side surface of the external insulating layer in a direction perpendicular to a thickness direction of the common mode filter.

* * * * *